United States Patent [19]

Makowiecki et al.

[11] Patent Number: 5,392,981
[45] Date of Patent: Feb. 28, 1995

[54] FABRICATION OF BORON SPUTTER TARGETS

[75] Inventors: Daniel M. Makowiecki; Mark A. McKernan, both of Livermore, Calif.

[73] Assignee: Regents Of The University Of California, Oakland, Calif.

[21] Appl. No.: 161,605

[22] Filed: Dec. 6, 1993

[51] Int. Cl.⁶ .............. B23K 31/00; B23K 101/36; C23C 14/34
[52] U.S. Cl. .................. 228/122.1; 228/124.5; 228/262.8; 204/192.15; 204/192.16
[58] Field of Search ............. 228/122.1, 124–125, 228/221, 262.8; 204/192.15, 192.16; 29/620, 25, 42

[56] References Cited

U.S. PATENT DOCUMENTS

| | | | |
|---|---|---|---|
| 4,135,286 | 1/1979 | Wright et al. | 204/192 R |
| 4,209,375 | 1/1980 | Gates et al. | 204/192 R |
| 5,032,468 | 7/1991 | Dumont et al. | 428/636 |
| 5,180,478 | 1/1993 | Hughes | 204/298.09 |
| 5,215,639 | 6/1993 | Boys | 204/192.12 |

Primary Examiner—Samuel M. Heinrich
Attorney, Agent, or Firm—Henry P. Sartorio; L. E. Carnahan

[57] ABSTRACT

A process for fabricating high density boron sputtering targets with sufficient mechanical strength to function reliably at typical magnetron sputtering power densities and at normal process parameters. The process involves the fabrication of a high density boron monolithe by hot isostatically compacting high purity (99.9%) boron powder, machining the boron monolithe into the final dimensions, and brazing the finished boron piece to a matching boron carbide ($B_4C$) piece, by placing aluminum foil there between and applying pressure and heat in a vacuum. An alternative is the application of aluminum metallization to the back of the boron monolithe by vacuum deposition. Also, a titanium based vacuum braze alloy can be used in place of the aluminum foil.

13 Claims, 2 Drawing Sheets

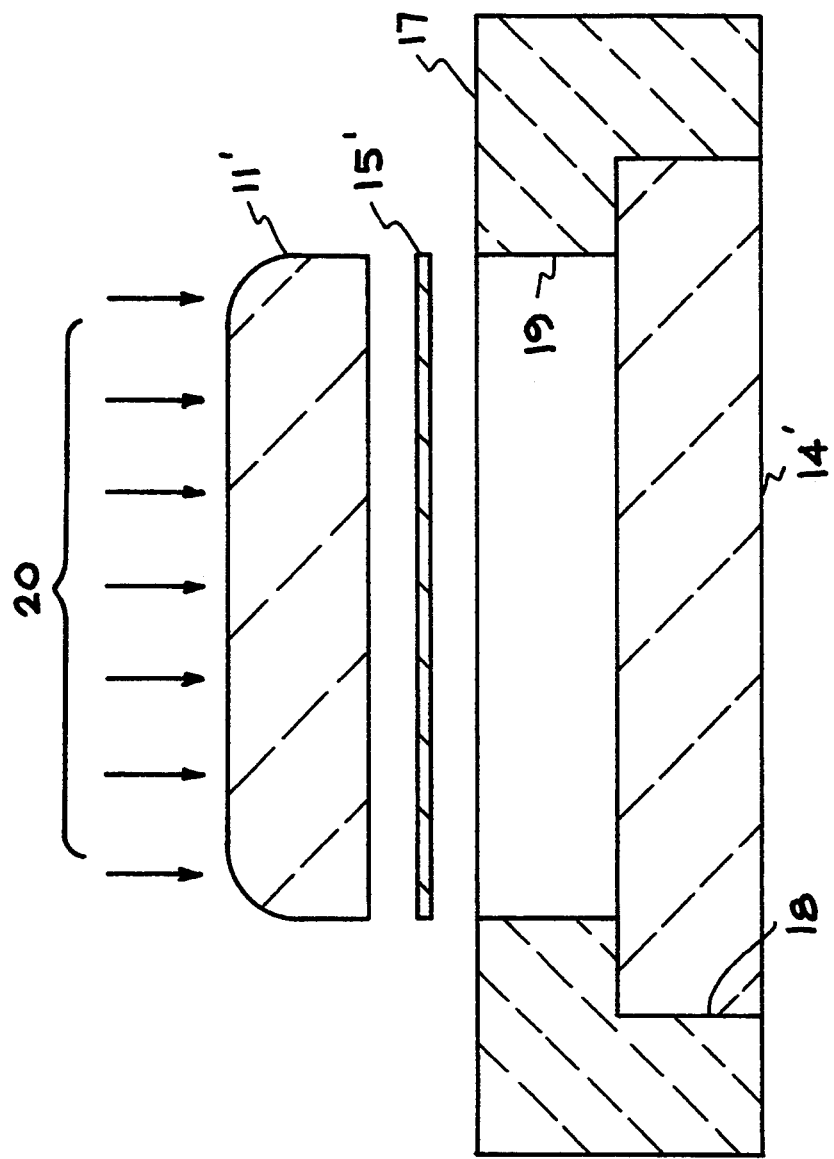

FABRICATION OF BORON SPUTTER TARGETS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the fabrication of targets for sputter deposition techniques, particularly to a process for producing high density boron sputtering targets, and more particularly to a process for fabricating dense boron targets compatible with magnetron sputtering.

Free-standing foils and films of pure elemental boron are attractive for a variety of applications including x-ray optics and wear resistant hard coatings. Boron films and foils have been prepared by evaporation and in a few instances by sputtering. However, the practical deposition of boron films by the versatile magnetron sputtering process, has not been possible because of the unavailability of acceptable sputtering targets. Several approaches to fabricating sputtering targets of various materials have been developed, and are exemplified by U.S. Pat. No. 4,135,286 issued January 23, 1979 to R. J. Wright et al.; U.S. Pat. No. 4,209,375 issued Jun. 24, 1980 to W. G. Gates et al.; and U.S. Pat. No. 5,032,468 issued Jul. 16, 1991 to C. M. Dumont et al.

Dense boron is not commercially available in sufficiently large pieces for the fabrication of even the smallest sputter target. Commercially available boron sputter targets are only about 50% of theoretical density (density of 2.37gm/cc) and very fragile. Another problem that complicates the fabrication of practical boron sputter targets even from fully dense material is its poor mechanical properties. Boron is a brittle material that fractures easily when subjected to the slightest applied stress. Thus, there is a need in the art for boron sputter targets, particularly such targets which are compatible with the power densities and process parameters of a magnetron sputtering process.

The present invention satisfies this need by providing a process for fabricating practical sputter targets from a dense boron monolith prepared by a hot isostatic pressing (HIP) process. The boron sputter targets produced by this invention are suitable for operation at normal sputtering parameters by reinforcing this fragile material with a unique vacuum brazing process.

SUMMARY OF THE INVENTION

It is an object of the present invention to provide a process for fabricating high density boron sputtering targets.

A further object of the invention is to provide a process for fabricating high density boron sputtering targets that have sufficient mechanical strength to function reliably at typical magnetron sputtering power densities and at normal process parameters.

Another object of the invention is to provide a boron sputtering target fabrication process using a mechanical boron monolith which is brazed to a matching piece of boron carbide, or by forming a metallized support on the boron monolith.

Other objects and advantages of the invention will become apparent from the following description and accompanying drawings. Basically, the invention is a process for fabricating high density boron sputtering targets. The process is carried out by first forming a high density boron monolith by hot isostatically compacting high purity boron powder; the boron monolith is then machined using standard ceramic grinding techniques to desired dimensions; a high purity aluminum foil is then placed between the boron and a piece of boron carbide, and then brazed together by placing under a load and applying heat in a vacuum, thereby producing a boron-aluminum-boron carbide structure. A titanium based vacuum braze alloy such as Ti—Cu—Ag or In—Ti—Cu—Ag can be substituted for the Al foil. Alternately, a boron sputtering target may be formed by simply applying an aluminum metallization to the back of a boron piece formed and machined as above described. Thus, the invention provides a boron sputtering target particularly adapted for magnetron sputtering of boron films and foils for use in x-ray optics, hard coatings for surface protection, and wear resistant coatings in disc drives and memory discs.

BRIEF DESCRIPTION OF THE DRAWINGS

The accompanying drawings, which are incorporated into and form a part of the disclosure, illustrate an embodiment of the process for carrying out the invention and, together with the description, serve to explain the principles of the invention.

FIG. 7 illustrates an embodiment of a mechanism for carrying out the brazing operation of the invention.

DETAILED DESCRIPTION OF THE INVENTION

The present invention is a process for fabricating high density boron sputtering targets with sufficient mechanical strength to function reliably at typical magnetron sputtering power densities and at normal process parameters. The process first involves the fabrication of a high density boron monolith of sufficient size for the desired target dimensions by hot isostatically compacting high purity (99.9%) boron powder. Hot isostatic compacting processes are known, as exemplified by U.S. Pat. No. 5,240,691, entitled "High Density Crystalline Boron Prepared by Hot Isostatic Pressing in Refractory Metal Containers", issued Aug. 31, 1993 to C. L. Hoenig and assigned to the same assignee. The second part of the process involves machining of the boron monolith into the final dimensions by standard ceramic grinding techniques. The final step in the process involves brazing the finished boron piece to a matching piece of boron carbide ($B_4C$) of similar dimensions. The braze involves, for example, placing a thin (0.002 inch) high purity (99.9%) aluminum foil between the boron and boron carbide pieces, applying a load (25 gm–200 gm) and heating in vacuum at a desired temperature (800° C.) for a specified time period (15 minutes).

An alternate approach to the above-described aluminum vacuum brazing process is the application of an aluminum metallization to the back of the boron piece or target by a vacuum deposition process. Such processes are known, with such being exemplified by the process described and claimed in U.S. patent application Ser. No. 08/042,704 filed Apr. 5, 1993, entitled "Process For The Fabrication Of Aluminum Metallized Pyrolytic Graphite Sputtering Targets", assigned to the same assignee. The aluminum metallization reinforces the fragile boron (B) target as did the aluminum (Al) to boron carbide (B$_4$C) vacuum braze. Although the Al metallized target is not as strong as the Al brazed target it adequately maintains target integrity and allows normal operation should cracks develop in the target.

A third alternate approach is to metallize the B and B$_4$C by any process suitable for subsequent vacuum brazing (PVD, CVD . . . ), and join the B to the B$_4$C by brazing the metallized surfaces with a commercial vacuum braze alloy (i.e. 72 Ag28 Cu). The mating or joining faces of the B and B$_4$C are metallized by a commercial braze alloy melting in the range of 700°–1000° C.

A fourth approach would be to use a titanium based vacuum braze alloy, e.g., the braze alloy in the third method with a 2% Ti or a 10% In+2% Ti addition, as a direct replacement for the aluminum foil in the first method.

An example of the Al braze process is described hereinafter, and with reference to FIGS. 1-6.

Figure 1:
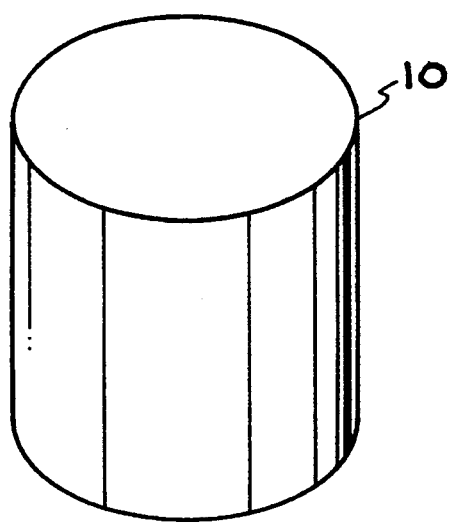
FIGS. 1–6 illustrate the results of a portion of the operational sequence of the process of the invention.
Figure 2:
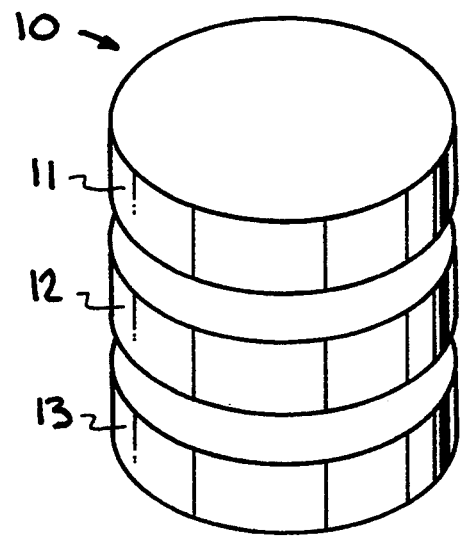
Figure 3:
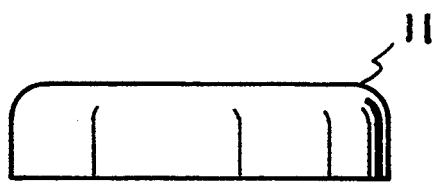
Figure 4:
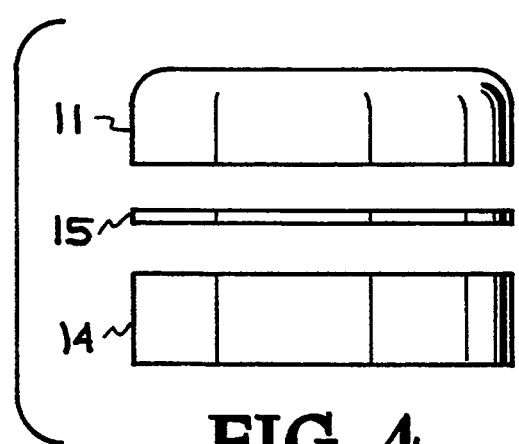
Figure 5:
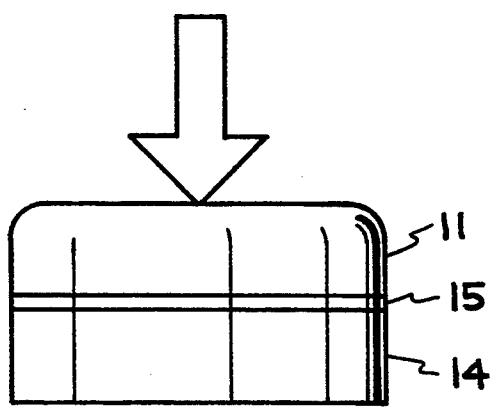
Figure 6:
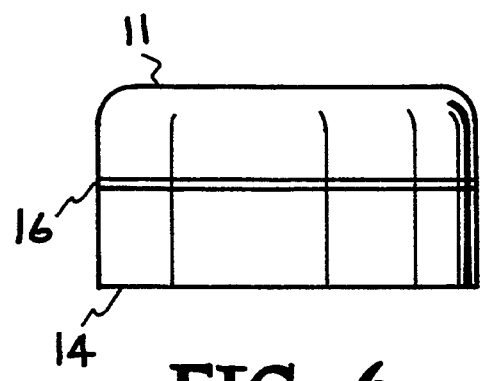

1. A boron monolith is first prepared using a tantalum (Ta) container or can filled with boron (B) powder.
2. The filled Ta can is sealed, as by welding.
3. The boron powder then undergoes densification in an HIP process, using a temperature of 1700° C. and pressure of 0.21 GPa of argon for 2-4 hours. More generally, the temperature is 1700°–2000° C. and the pressure is 0.2–0.4 GPa. Further details of the boron HIP process are described in U.S. Pat. 5,240,691 which is herein incorporated by reference.
4. The Ta can is then removed, leaving a rough boron monolith cylinder as indicated at 10 in FIG. 1. The only size limit is the HIP capacity.
5. The boron cylinder 10 is then machined by standard ceramic machining techniques to the diameter of a desired target, and the cylinder 10 is sliced to form the desired target thickness (range of 2 mm to 10 mm), three (3) targets being formed from cylinder 10 in this embodiment, as indicated at 11, 1.2 and 13 in FIG. 2.
6. The sharp edges of the boron monoliths or targets 11–13 are rounded or radiused by grinding to remove flaws, and the surfaces are then lapped, leaving a configured target 11, for example, as shown in FIG. 3.
7. A piece of boron carbide B$_4$C indicated at 14 is then provided such that the diameter and thickness is substantially the same as monolith target 11, or may be of a greater diameter, and a thin (0.05mm) foil of aluminum, indicated at 15, is placed between the target 11 and the B$_4$C piece 14, as shown in FIG. 4. The thickness of the aluminum foil may range from 0.02 mm to 0.1 mm and the B$_4$C from 2 mm to 10 mm.
8. The assembly (11–15–14) is then placed in a vacuum furnace at 820° C. under a load of 25 grams/cm$^2$ for a time period of 15 minutes, as indicated in FIG. 5, to produce a braze of the B to the B$_4$C, which results in a composite or bonded target 16 as indicated in FIG. 6. The temperature may range from 700° to 1000° C. and the time from 2 to 120 min. Any load of at least 2 gm/cm$^2$ can be used.

The thermal expansions of B target 11 and B$_4$C piece 14 are sufficiently close to allow the bonded target 16 to survive the brazing process. The B portion 11 may crack from the thermal stresses in the sputtering process, but the high temperature capability of the high strength aluminum braze maintains target integrity, and it allows normal operation of the cracked target. The use of a cracked B target had no adverse affect on the sputtering process.

FIG. 7 schematically illustrates a mechanism used in experimentally verifying the B/B$_4$C brazing process, and includes a carbon fixture 17 being formed to include cutaway sections 18 and 19 to retain the boron carbide piece 14′, the aluminum film 15′, and the boron monolith or target 11′. As indicated at 20, a load (200 gm/cm$^2$) is applied to the B/Al/B$_4$C assembly retained in fixture 17 while under a selected temperature (820° C. for example) in a vacuum, to produce the braze of the B to the B$_4$C.

It has thus been shown that the present invention provides a process for fabricating practical boron sputter targets from a dense boron monolith prepared by a hot isostatic pressing (HIP) process. The boron sputter targets are made suitable for operation at normal sputtering parameters by reinforcing this fragile material with a vacuum brazing process. The thus produced boron targets are well adapted for use with the magnetron sputtering apparatus, thereby greatly advancing the use of boron films, etc.

While particular embodiments of the target have been illustrated and a specific example of the process and apparatus for producing the reinforced boron target have been set forth, such are for example purposes only. Modifications and changes will become apparent to those skilled in the art, and it is intended that the invention be limited only by the scope of the appended claims.

We claim:

1. A process for fabricating high density boron sputtering targets, comprising:
   providing a boron monolith; and
   reinforcing the boron monolith by providing aluminum metallization on one side of the boron monolith.

2. A process for producing high density boron sputtering targets comprising:
   forming a boron monolith from boron powder; and
   reinforcing the boron monolith by:
   providing a piece of boron carbide;
   positioning between the boron monolith and the piece of boron carbide a material selected from the group of aluminum foil and titanium containing vacuum braze alloy; and
   brazing the boron and boron carbide together to form a reinforced boron sputtering target.

3. The process of claim 2, wherein the boron monolith is formed by a hot isostatic pressing process.

4. The process of claim 3, wherein the boron powder has a 99.9% purity.

5. The process of claim 4, wherein the boron powder is contained in a tantalum container during the hot isostatic pressing process.

6. The process of claim 3, additionally including machining and slicing the thus produced boron monolith to form a desired boron target configuration.

7. The process of claim 2, wherein the material is aluminum foil having a thickness in the range of 0.02 mm to 0.1 mm.

8. The process of claim 7, wherein the boron monolith has a thickness in the range of 2 mm to 10 mm.

9. The process of claim 8, wherein the boron carbide piece has a thickness in the range of 2 mm to 10 mm.

10. The process of claim 3, wherein the hot isostatic pressing process utilizes a temperature in the range of 1700° to 2000° C., and a pressure of 0.2 to 0.4 GPa.

11. The process of claim 2, wherein the brazing process is carried out in a vacuum at a temperature in the range of 700° to 1000° C., and a pressure of at least 2 gm/cm$^2$.

12. A process for fabricating high density boron sputtering targets comprising:
   providing a boron monolith; and
   reinforcing the boron monolith by:
   providing a piece of B$_4$C;
   metallizing mating surfaces of the boron and B$_4$C; and
   brazing the metallized surfaces of the boron and B$_4$C together to form a reinforced boron sputtering target.

13. A boron carbide reinforced boron target produced by the process of claim 2.

* * * * *